US 10,803,890 B2

(12) United States Patent
Huang et al.

(10) Patent No.: US 10,803,890 B2
(45) Date of Patent: Oct. 13, 2020

(54) REDUCING OFFSET OF A DIFFERENTIAL SIGNAL OUTPUT BY A CAPACITIVE COUPLING STAGE OF A HARD DISK DRIVE PREAMPLIFIER

(71) Applicant: Marvell World Trade Ltd., St. Michael (BB)

(72) Inventors: Xiaowei Huang, Singapore (SG); Ma Lin, Singapore (SG); Niviya Chacko, Singapore (SG); Sheng Ming Lai, Singapore (SG); Chee Guan Tan, Singapore (SG)

(73) Assignee: Marvell Asia Pte., Ltd., Singapore (SG)

(*) Notice: Subject to any disclaimer, the term of this patent is extended or adjusted under 35 U.S.C. 154(b) by 0 days.

(21) Appl. No.: 16/703,694

(22) Filed: Dec. 4, 2019

(65) Prior Publication Data
US 2020/0184998 A1      Jun. 11, 2020

Related U.S. Application Data

(60) Provisional application No. 62/775,781, filed on Dec. 5, 2018.

(51) Int. Cl.
*G11B 5/02* (2006.01)
*G11B 5/39* (2006.01)
*H03F 3/45* (2006.01)
*G11B 5/09* (2006.01)
*G11B 20/10* (2006.01)

(52) U.S. Cl.
CPC ............... *G11B 5/39* (2013.01); *G11B 5/09* (2013.01); *H03F 3/45071* (2013.01); *H03F 2200/165* (2013.01); *H03F 2200/228* (2013.01); *H03F 2200/375* (2013.01); *H03F 2203/45044* (2013.01); *H03F 2203/45544* (2013.01); *H03F 2203/45588* (2013.01)

(58) Field of Classification Search
CPC . G11B 20/0013; G11B 5/02; G11B 20/10027; G11B 5/012; G11B 5/03; G11B 2005/0018; G11B 5/09; G11B 20/10
USPC .................................. 360/65, 66, 67, 68, 46
See application file for complete search history.

(56) References Cited

U.S. PATENT DOCUMENTS 6,166,566 A * 12/2000 Strong .................. H03K 5/082
                                                              327/307

* cited by examiner

*Primary Examiner* — Nabil Z Hindi

(57) ABSTRACT

A preamplifier comprises an input stage and a capacitive coupling stage. The input stage is arranged to receive a differential signal from a magnetic resistor which indicates a magnetic field sensed on a magnetic disk of a hard disk drive (HDD) when the preamplifier is powered on from an off state. The capacitive coupling stage has an input arranged to receive the differential signal from the input stage, a filter comprising a first resistor, a second resistor, a first capacitor, a second capacitor, and switches arranged in parallel with respective resistors, where the switches are closed when the preamplifier is powered on from the off state to an on state. A switch control is arranged to determine that an offset of the differential signal has settled and open the switches based on the determination.

20 Claims, 6 Drawing Sheets

REDUCING OFFSET OF A DIFFERENTIAL SIGNAL OUTPUT BY A CAPACITIVE COUPLING STAGE OF A HARD DISK DRIVE PREAMPLIFIER

CROSS REFERENCE TO RELATED APPLICATION

This disclosure claims the benefit of priority under 35 U.S.C. § 119(e) of U.S. Provisional Application Ser. No. 62/775,781 filed Dec. 5, 2018, entitled, "Circuits and methods for reducing dynamic offset of capacitive coupling with minimum time in HDD preamp signal path", the contents of which is incorporated herein by reference in its entirety.

FIELD OF USE

This disclosure generally relates to the field of data storage, and more particularly to reducing offset of a differential signal output by a capacitive coupling stage of a hard disk drive (HDD) preamplifier.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Hard disk drives (HDDs) have one or more magnetic disks and a read/write head positioned over the one or more magnetic disks for reading and writing data to the one or more magnetic disks. The read/write head has a magnetic source such as a magnetic coil which applies a varying magnetic field to the magnetic disk indicative of data to be written to the magnetic disk as the disk rotates. The magnetic field magnetizes portions of the magnetic disk in accordance with the applied magnetic field to write the data to the magnetic disk.

The HDD has a read block with a magnetic resistor (MR) stage located in the read/write head of the HDD and a preamplifier. A magnetic resistor (MR) has a property that its resistance changes as a function of a magnetic field. The MR stage includes one or more MRs. To read the data on the magnetic disk, the MR stage uses the MRs to sense the magnetization of the magnetic disk under a read head as the magnetic disk rotates and outputs a differential signal indicative of sensed magnetization. The preamplifier processes this differential signal by three stages which include an input stage, a capacitive coupling stage, and a gain stage. The input stage provides a bias voltage to the MR stage to facilitate sensing of the magnetic field. The capacitive coupling stage has one or more capacitors and resistors which act as high pass filter to filter the differential signal output by the MR stage including low frequency noise and direct current (DC) signals. The filtered signal is then provided to the gain stage which adjusts one or more of a gain, bandwidth, and boost of the filtered signal to facilitate signal processing to recover the data written to the HDD based on the filtered signal.

An offset of the differential signal output by the MR stage initially exceeds a threshold when the preamplifier is powered on from an off state to an on state. Also, the charge of the capacitors in the capacitive coupling stage varies when the preamplifier is powered from an off state to an on state. The filtering and amplification of this differential signal with offset by the preamplifier produces distortion in the amplified differential signal and errors in reading the data on the magnetic disk.

SUMMARY

This disclosure generally relates to the field of data storage, and more particularly to reducing offset of a differential signal output by a capacitive coupling stage of a hard disk drive (HDD) preamplifier.

Aspects of the disclosure provide a preamplifier comprising an input stage; a capacitive coupling stage; the input stage arranged to receive a differential signal from a magnetic resistor (MR) which indicates a magnetic field sensed on a magnetic disk of a hard disk drive (HDD) when the preamplifier is powered on from an off state to an on state; the capacitive coupling stage having: one or more inputs arranged to receive the differential signal from the input stage; a filter comprising a first resistor, a second resistor, a first capacitor, and a second capacitor; an amplifier comprises a first input and a second input, wherein the first capacitor is coupled to the first input and the second capacitor is coupled to the second input; a first switch and a second switch in parallel with respective resistors, the first switch and the second switch being closed to short the first resistor and the second resistor when the preamplifier is powered on from the off state to the on state and to ground the first input and the second input of the amplifier; an switch control arranged to determine that an offset of the differential signal has settled and to open the first switch and the second switch based on the determination to cause the first resistor and the second resistor to not be shorted and to not ground the first input and the second input of the amplifier; and an output arranged to provide a filtered and amplified differential signal.

In one example, the filter is a high pass filter which filters a direct current (DC) signal of the differential signal when the first switch and the second switch are open. In another example, the preamplifier further comprises a gain stage for providing the filtered and amplified differential signal to signal processing circuitry which determines data on the magnetic disk based on the differential signal. In yet another example, the switch control comprises a delay timer arranged to open the one or more switches based on a determination that a predetermined time has passed. In another example, the predetermined time is a duration that the preamplifier is powered on from the off state to the on state. In yet another example, the delay timer is coupled to a power supply to receive a signal from the power supply to start the delay timer. In another example, the delay timer outputs a signal to open the one or more switches based on the determination that the predetermined time has passed. In another example, the switch control comprises a comparator arranged to receive the differential signal, determine the offset of the differential signal, and compare the offset to a threshold. In yet another example, the comparator is further arranged to output a signal to open the one or more switches based on the offset being less than the threshold. In another example, the comparator comprises two inputs which receive respective signals of the differential signal.

Aspects of the disclosure provide a method comprising receiving a differential signal associated with a magnetic resistor which indicates a magnetic field sensed on a magnetic disk of an HDD when a preamplifier of the HDD is powered on from an off state; determining that an offset of the differential signal has settled; and filtering, by a filter, the differential signal based on the determination.

In one example, determining that the offset has settled comprises determining that a predetermined time has passed. In another example, the predetermined time is a duration that the preamplifier is powered on from the off state. In yet another example, determining that the offset of the differential signal has settled comprises receiving an input from a power supply to start a delay timer. In another example, determining that the offset of the differential signal has settled comprises receiving, by a comparator, the differential signal, determining, by the comparator, the offset of the differential signal, and comparing, by the comparator, the offset to a threshold. In yet another example, the method comprises shorting, by a first switch and a second switch, resistors of the filter when the preamplifier is in the off state, wherein the short grounds a first input and a second input of an amplifier coupled to capacitors of the filter and opening the first switch and the second switch based on the determination that the offset of the differential signal has settled which causes the resistors to not be shorted and the first input and the second input of the amplifier to not be grounded. In another example, the method comprises outputting by a delay timer a signal to open the one or more switches based on the determination that a predetermined time has passed. In yet another example, the method comprises outputting, by a comparator, a signal to open the one or more switches based on the offset being less than a threshold. In another example, the method comprises providing the differential signal which is filtered to signal processing circuitry which determines data on the magnetic disk based on the differential signal.

Aspects of the disclosure provide a capacitive coupling stage of a preamplifier, the capacitive coupling stage comprising: one or more one buffers coupled to respective inputs of an input stage of the preamplifier; an amplifier; a filter comprising a first resistor with a first terminal coupled to a first input of the amplifier and a second terminal coupled to ground, a second resistor with a third terminal coupled to a second input of the amplifier and a fourth terminal coupled to the ground, and capacitors; a first switch and a second switch, wherein a fifth terminal of the first switch is coupled to the first terminal, a sixth terminal of the first switch is coupled to the second terminal, a seventh terminal of the second switch is coupled to the third terminal and an eighth terminal of the second switch is coupled to the fourth terminal, the first switch and second switch arranged to be opened or closed; a switch control arranged to determine that an offset of a differential signal received from the input stage has settled and to open the first switch and the second switch which are closed based on the determination; and an output.

Figure 1:
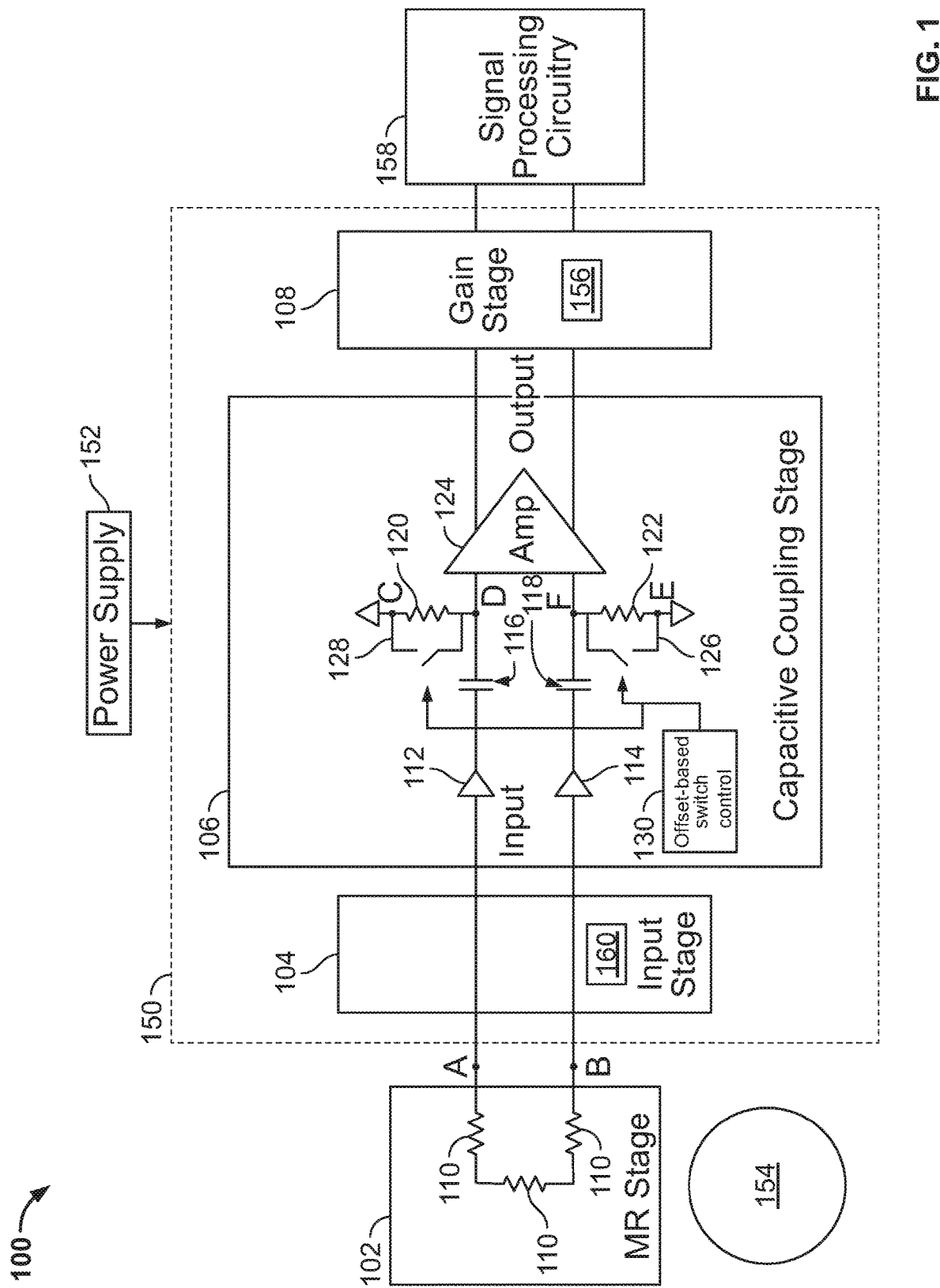
FIG. 1 illustrates an example of a capacitive coupling stage associated with a read block of a hard disk drive (HDD).

The drawings are for the purpose of illustrating example embodiments, but it is understood that the embodiments are not limited to the arrangements and instrumentality shown in the drawings.

DETAILED DESCRIPTION

This disclosure provides examples and details related to data storage. A capacitive coupling stage of a preamplifier in a hard disk drive (HDD) is disclosed which is arranged to reduce offset of a differential signal output by the capacitive coupling stage when the preamplifier is powered on from an off state to an on state. The disclosed capacitive coupling stage is not limited to use in the preamplifier of the HDD and may be used in other types of signal processing circuitry.

FIG. 1 illustrates an example of a capacitive coupling stage 106 associated with a read block 100 of an HDD. The read block 100 includes a magnetic resistor (MR) stage 102 and a preamplifier 150 which includes an input stage 104, the capacitive coupling stage 106, and a gain stage 108. The MR stage 102 may be located on a circuit board while the preamplifier 150 may integrated on a semiconductor chip. Further, a power supply 152 may power the preamplifier 150. The MR stage 102, input stage 104, capacitive coupling stage 106, gain stage 108, and power supply 152 may include hardware and/or circuitry for performing disclosed functions.

The MR stage 102 may be in a read/write head positioned over a rotating magnetic disk 154 of the HDD. Portions of the magnetic disk 154 may be already magnetized in accordance with a magnetic field applied during a write process to write the data to the magnetic disk 154. The MR stage 102 has one or more MRs 110 whose resistance changes in presence of a magnetic field. As the magnetic disk 154 rotates in the HDD, the resistance of the magnetic resistors 110 changes. Based on this change in resistance, the MR stage 102 outputs a differential signal. A differential signal comprises complementary signals where each signal ideally has a same magnitude and opposite sign. For example, one signal of the differential signal may be at 1 volt and the other signal of the differential signal may be at −1 volt, and a 2 volt difference between the differential signals voltages conveys information. The differential signal indicates the magnetic field sensed by the one or more magnetic resistors 110 and the data written to the magnetic disk 154.

The input stage 104 receives the differential signal such as a 50 mv peak-to-peak signal output by the MR stage 102 at nodes A and B between the MR stage 102 and the input stage 104 and provides the differential signal to the capacitive coupling stage 106. One signal of the differential signal may be located at node A and another signal of the differential signal may be located at node B. The input stage 104 also provides a bias to the magnetic resistor 110 of the MR stage 102 to facilitate the sensing of the magnetic field by the MR stage 102. The bias may be a fixed bias voltage set in a register 160 of the input stage 104 and/or a fixed bias current set in the register 160 of the input stage 104. The bias voltage may be a voltage between 0 to 200 mv and the bias current may be current between 0 to 1.2 milliamps in some examples.

The differential signal may be a time varying signal with low frequency components such as low frequency noise and direct current (DC) signals. The low frequency noise may include flicker noise on the signals of the differential signal and the DC signals may show up as a level shift on one or both signals of the differential signal. For example, a signal of the differential signal may be ideally centered at zero volts, but if the signal has an offset, the signal is no longer centered at zero.

The capacitive coupling stage 106 may include an amplifier 124, buffers 112, 114, capacitors 116, 118, and resistors 120, 122. The buffers 112, 114 provide an electrical impedance between the input stage 104 and the capacitive coupling stage 106 to prevent the capacitive coupling stage 106 from loading the input stage 104 and interfering with operation of the input stage 104. The capacitors 116, 118 and resistors 120, 122 may define a high pass filter which filters the DC signals and low frequency noise of the differential signal. The amplifier 124 may have two inputs to amplify a filtered differential signal for output by the capacitive coupling stage 106 to the gain stage 108. Further, the capacitive coupling stage 106 has switches 128, 126. The switches 128, 126 may be arranged in parallel with respective resistors 120, 122 to short the respective resistors 120, 122 when the switches 128, 126 are closed and not short the respective resistors 120, 122 when the switches 128, 126 are open. By a switch shorting a resistor, a conductive path is provided across terminals of the resistor while when the switch is closed and when the switch is open no conductive path is provided across terminals of the resistor. Further, the switches 128, 126 when closed may also ground inputs of the amplifier 124 and the switches when open may not also ground inputs of the amplifier 124. For illustration purposes, the switches 128, 126 are shown as being open in the capacitive coupling stage 106.

In examples, the resistor 120, 122, switch 128, 126, amplifier 124, capacitor 116, 118, and buffer 112, 114 may be arranged to filter the differential signal to reduce the DC signals and low frequency noise and amplify the filtered differential signal. The arrangement may include one terminal of the resistor 120 and switch 128 being coupled together and grounded at node C of the capacitive coupling stage 106 and another terminal of resistor 120 and switch 128 being coupled together with an input of the amplifier at node D of the capacitive coupling stage 106. The arrangement may also include one terminal of resistor 122 and switch 126 being coupled together and grounded at node E of the capacitive coupling stage 106 and another terminal of resistor 122 and switch 126 being coupled together with an input of the amplifier at node F of the capacitive coupling stage 106. Further, buffer 112 may be coupled to the capacitor 116 and buffer 114 may be coupled to the capacitor 118. For example, one terminal of buffer 112 may be coupled to one terminal of the capacitor 116 and another terminal of the capacitor 116 may be coupled to node D. Also, buffer 114 may be coupled to one terminal of the capacitor 118 and another terminal of the capacitor 118 may be coupled to node F.

The capacitive coupling stage 106 may be coupled to the gain stage 108. The gain stage 108 may include one or more amplifiers (not shown) for further amplifying the filtered and amplified differential signal output by the capacitive coupling stage 106. The gain stage 108 controls one or more of a gain, bandwidth, frequency boost of the filtered signal based on register settings of a register 156 for subsequent signal processing to recover the data written to the HDD. For example, the gain stage 108 may amplify the filtered signal by a 10× gain and the amplified filtered signal may be a 500 mv peak-to-peak signal which is provided to signal processing circuitry 158 to determine the data stored on the magnetic disk 154.

The preamplifier 150 may be in an "off state" when it is not receiving any power from the power supply 152 and an "on state" when the preamplifier 150 is receiving power from the power supply 152. When the preamplifier 150 powered on from an "off state" to the "on state" the differential signal input into the capacitive coupling stage 106 may have an offset. The offset may be a difference in absolute values of voltages of the signals of the differential signals resulting from a DC signal and/or low frequency noise on one or both signals of the differential signal. For example, if one signal of a differential signal has a voltage of 1.1 volts (i.e., 0.1 volt DC signal) and the other signal of the differential signal has a voltage of −1 volt (i.e., 0 volt DC signal), then the offset of the differential signal may be 0.1 volts. The offset is also known as a common mode of the differential signal computed as a vector sum of voltages of each signal A and B of the differential signal divided by 2. The offset of the preamplifier 150 may be dynamic and initially greater than a threshold amount when the preamplifier 150 is powered on from an "off state" to the "on state". Further, the capacitors 116, 118 in the on state may not be initially charged to effectively filter the low frequency noise and DC signals on the signals of the differential signal when the preamplifier 150 is powered on from an "off state" to the "on state." As a result, the amplifier 124 and gain stage 108 amplifies residual offset of the differential signal. The offset produces distortion in the amplified differential signal and errors in reading the data on the magnetic disk 154 based on the amplified differential signal.

Offset-based switch control 130 may control the switching of the switches 128, 126 so that amplification of a differential signal with residual offset is reduced. The switches 128, 126 may be initially closed when the preamplifier 150 is in the "off state", grounding the input of the amplifier 124 and shorting the resistors 120, 122. The differential signal at buffers 112, 114 may not be filtered by the capacitors 116, 118 and resistors 120, 122 and the amplifier 124 and gain stage 108 do not amplify the differential signal. The preamplifier 150 may be powered on from the "off state" to the "on state." The offset-based switch control 130 may then open the switches 128, 126 when the offset has settled and/or capacitive charge of the capacitors 116, 118 have settled. The offset may have settled if the offset is less than or equal to a threshold amount and the capacitive charge may have settled if it varies by less than a threshold amount. By opening the switches 128, 126, the capacitive coupling stage 106 is arranged to filter the differential signal. Further, the inputs of the amplifier 124 are no longer grounded and the amplifier 124 amplifies the filtered differential signal. By controlling when the capacitive coupling stage 106 amplifies and filters the differential signal, the gain stage 108 does not amplify differential signals having the relatively large offset when the preamplifier 150 is powered on from the "off state" to the "on state" which otherwise results in a distorted amplified differential signal compared to when the preamplifier is in the "on state" and the offset has settled.

Figure 2:
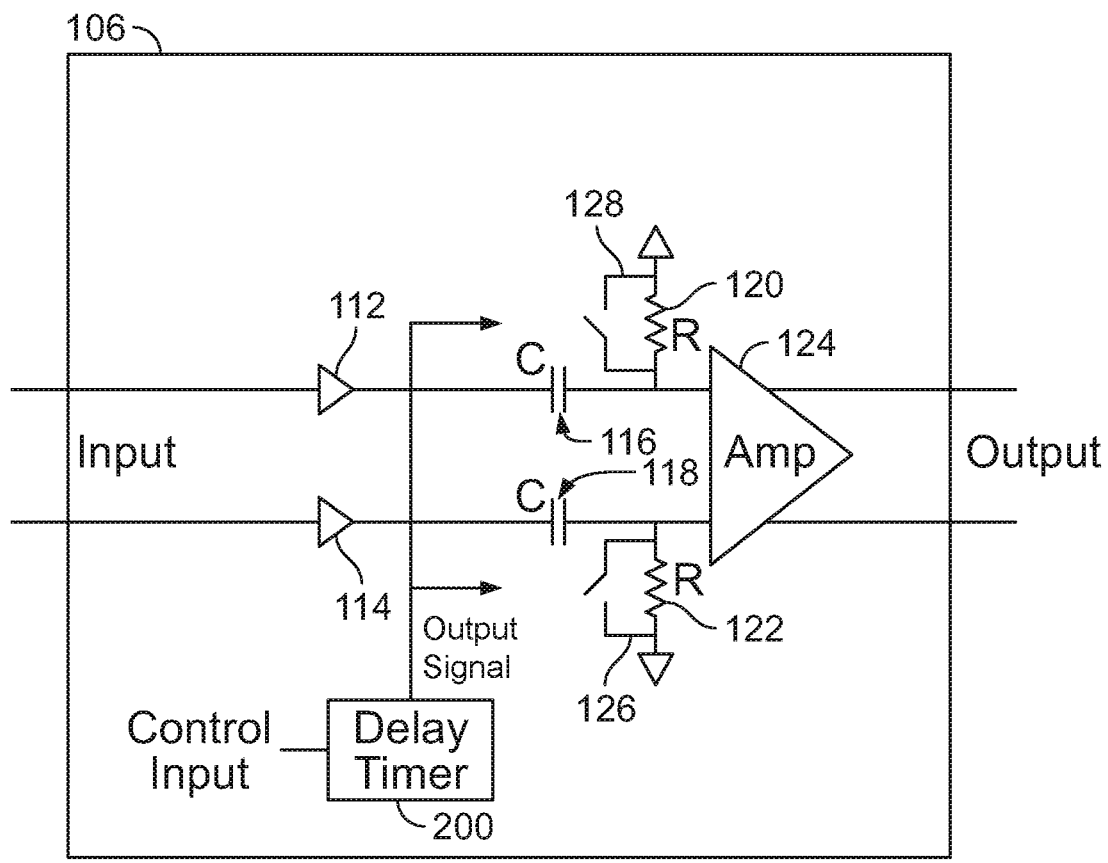
FIG. 2 illustrates another example of a capacitive coupling stage associated with the read block of the HDD.

FIG. 2 illustrates another example of the capacitive coupling stage 106 associated with the read block of the HDD. The capacitive coupling stage 106 in FIG. 2 includes a delay timer 200 for reducing the offset of the differential signal output by the capacitive coupling stage 106. The capacitive coupling stage 106 which is shown includes certain components similar to those described with respect to FIG. 1 including buffers 112, 114, capacitors 116, 118, resistors 120, 122, switches 128, 126, and amplifier 124. The description of these components has been provided above and will be omitted here for clarity purposes.

The delay timer 200 may control when the capacitive coupling stage 106 filters and amplifies the differential signal input into the capacitive coupling stage 106. The delay timer 200 may have an input and output. The power supply 152 may apply a signal to a control input such as an enable pin to start the delay timer 200 when the preamplifier 150 is powered on from an off state to an on state. The delay timer 200 may include a counter to measure whether a predetermined time has passed after the delay timer 200 is started. The predetermined time may be an estimated duration of time for how long it takes for the offset of the differential signal to settle after the preamplifier 150 is powered on from the "off state" to the "on state" and the capacitive charge of the capacitors 116, 118 to settle after the preamplifier 150 is powered on from the "off state" to the "on state. After this settling, the capacitive coupling stage 106 is arranged to filter the differential signal. So long as the predetermined time has not passed, the switches 126, 128 may be closed so that the inputs to the amplifier 124 are grounded, the resistors 120, 122 are shorted, and the differential signal input into the capacitive coupling stage 106 is not filtered or amplified. After the predetermined time has passed, the delay timer 200 generates an output signal which opens the switches 126, 128 so that the resistors 120, 122 are no longer shorted. The capacitive coupling stage 106 may be arranged to filter the differential signal input to the capacitive coupling stage 106 for output. Further, the inputs of the amplifier 124 are no longer grounded and the amplifier 124 amplifies the filtered differential signal.

The predetermined time associated by the delay timer 200 may not accurately predict when the offset of the differential signal has settled and the capacitive charge has settled. Depending on operation of the preamplifier 150, there may be instances when the delay timer 200 prematurely opens the switches 126, 128 to filter the differential signal resulting in the amplifier 124 and gain stage 108 amplifying residual offset because the offset of the differential signal input has not yet settled. Further, the delay timer 200 may not accurately measure the predetermined time because of process corners, supply voltage changes, and temperature variations associated with the delay timer 200.

Figure 3:
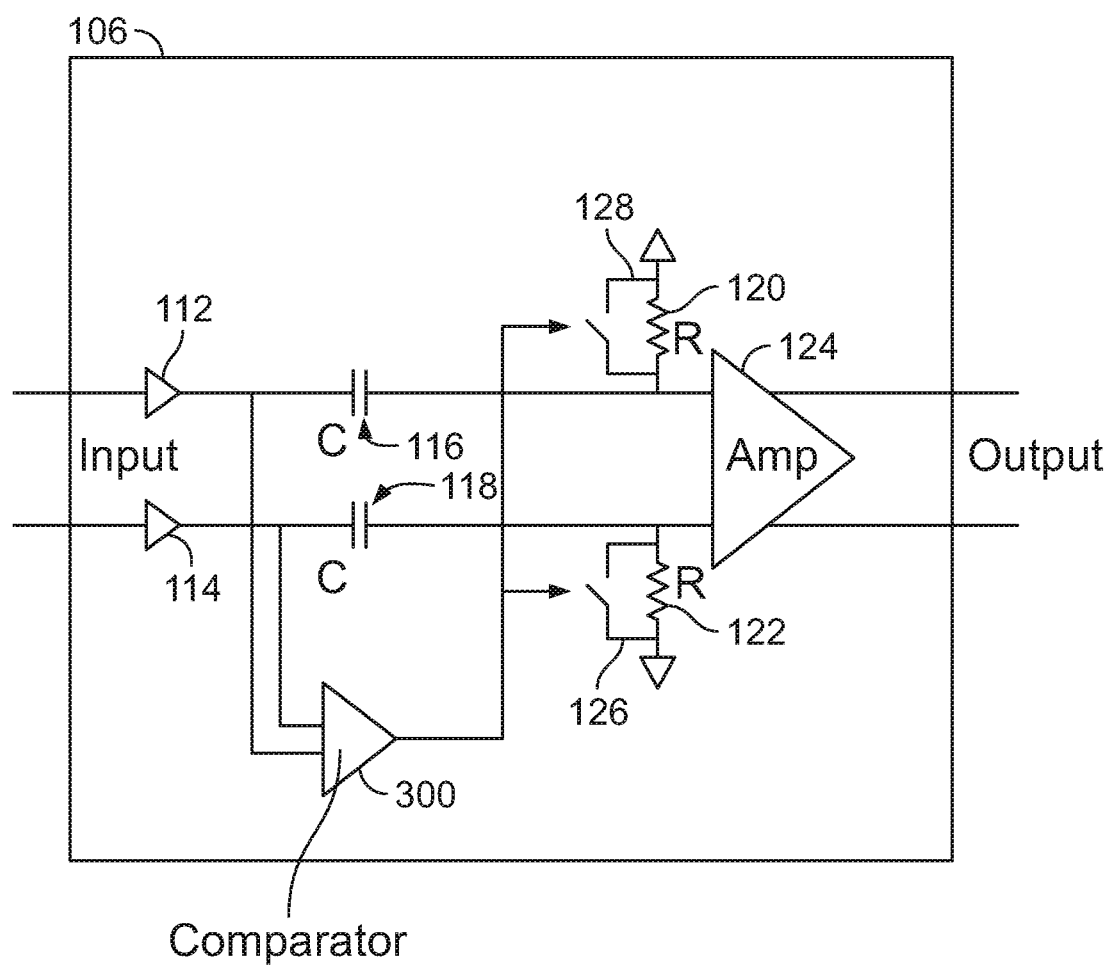
FIG. 3 illustrates yet another example of a capacitive coupling stage associated with the read block of the HDD.

FIG. 3 illustrates yet another example of the capacitive coupling stage 106 associated with the read block of the HDD. The capacitive coupling stage 106 in FIG. 3 has a comparator 300 for reducing the offset of the differential signal output by the capacitive coupling stage 106. The capacitive coupling stage 106 which is shown includes certain components similar to those described with respect to FIG. 1 including buffers 112, 114, capacitors 116, 118, resistors 120, 122, switches 126, 128, and amplifier 124. The description of these components has been provided above and will be omitted here for clarity purposes.

The comparator 300 may control when the capacitive coupling stage 106 filters the differential signal input into the capacitive coupling stage 106. The comparator 300 may have two inputs coupled to respective buffers 112, 114, and arranged to receive respective signals of the differential signal input into the capacitive coupling stage 106. When the preamplifier 150 is powered on from an off state to an on state, the switches 126, 128 may be closed so that the inputs to the amplifier 124 are grounded, the resistors 120, 122 are shorted, and the differential signal input into the capacitive coupling stage 106 is not filtered or amplified. The comparator 300 may determine an offset of the differential signal based on the signals of the differential signal and compare the offset to a threshold. The threshold may be a value greater than or equal to zero. If the offset is less or equal to than the threshold, then the comparator 300 may output a signal which causes the switch 126, 128 to open resulting in the resistors 120, 122 not being shorted so that the capacitive coupling stage 106 filters the differential signal. Further, the inputs of the amplifier 124 are no longer grounded and the amplifier 124 amplifies the filtered differential signal. The settling of the offset may also indicate that the capacitive charge of the capacitors 116, 118 has settled. Unlike the example of FIG. 2, use of the comparator 300 may result in a shorter time to begin filtering and amplification of the differential signal since the offset may settle in less than the predetermined time in some instances.

Figure 4:
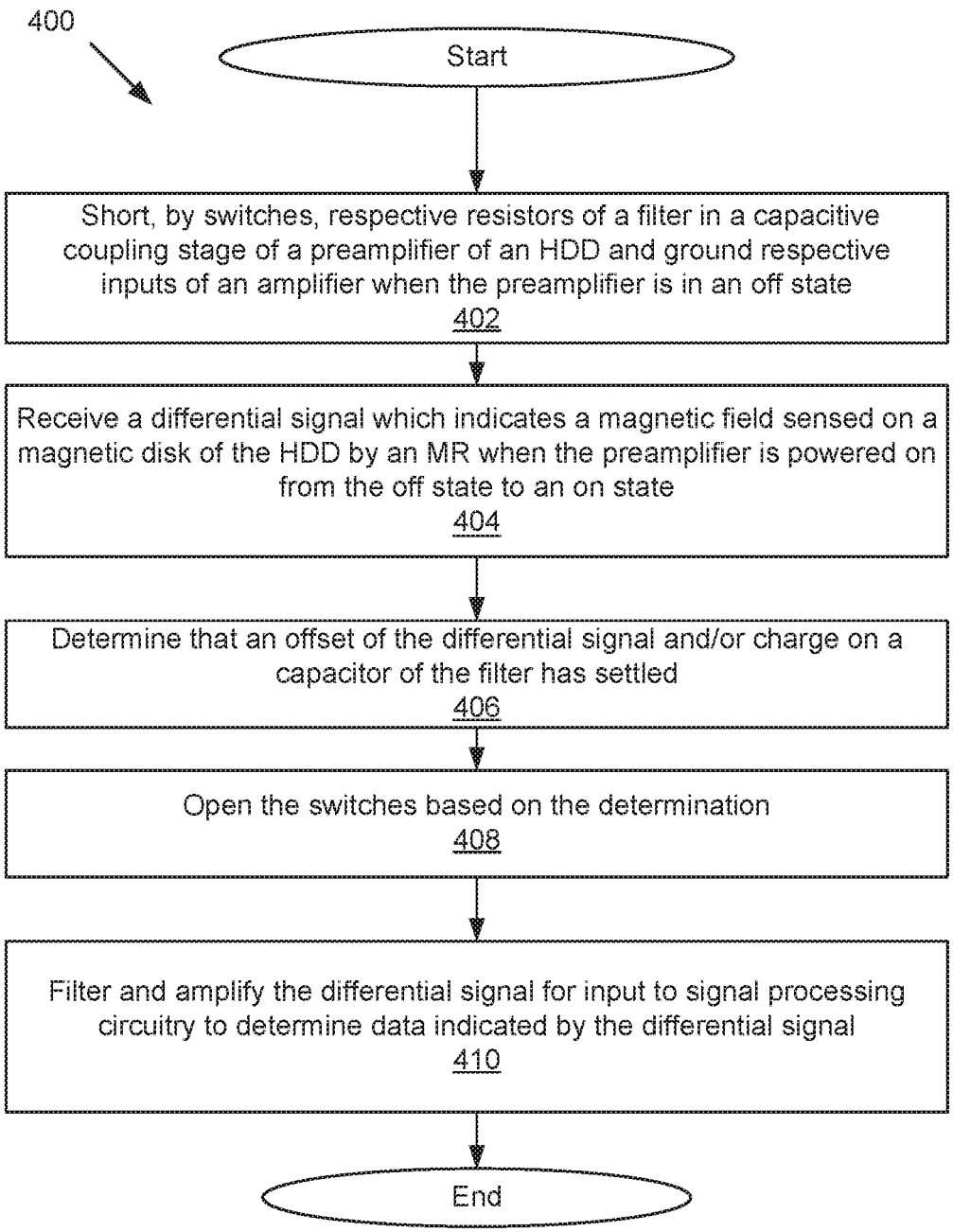
FIG. 4 is an example flow chart of functions associated with reducing offset of a differential signal output by the capacitive coupling stage.

FIG. 4 is an example flow chart of functions 400 associated with reducing offset of the differential signal output by the capacitive coupling stage 106 of the preamplifier 150. The functions 400 may be performed by the capacitive coupling stage 106 in hardware and/or circuitry.

At 402, one or more switches 126, 128 short respective resistors 120, 122 of a filter in a capacitive coupling stage 106 of a preamplifier 150 of an HDD and ground respective inputs of an amplifier 124 when the preamplifier 150 is in an off state. The preamplifier 150 may be in the off state when it is not powered by the power supply 152. By the shorting, the filter does not filter any differential signal and the amplifier 124 does not amplify any differential signal.

At 404, a differential signal is received which indicates a magnetic field sensed on a magnetic disk 154 of the HDD by an MR 110 when the preamplifier 150 is powered on from the off state to an on state. The differential signal may originate from the MR stage 102 and have an offset when the preamplifier 150 is powered on from the off state to the on state which is relatively large compared to when the preamplifier 150 is on and the offset has settled. The power supply 152 may power the preamplifier 150.

At 406, a determination is made that the offset of the differential signal and/or the charge on a capacitor of the filter has settled. The offset may be settled if it is less than or equal to a threshold. The offset-based switch control 130 may make this determination in many ways including based on use of the comparator 300 or the delay timer 200. Additionally, if the offset has settled, the capacitive charge of the capacitors 116, 118 may have settled.

At 408, the switches 126, 128 are open based on the determination. The offset-based switch control 130 may output a signal to open the switches 126, 128. The inputs of the amplifier 124 may be no longer coupled to ground and the resistors 120, 122 may not be shorted.

At 410, the differential signal is filtered and amplified for input to signal processing circuitry 158 to determine data indicated by the differential signal. The filter may be a high pass filter which filters the DC signal and/or low frequency noise to reduce amplification of any offset by the amplifier 124 and gain stage 108 of the preamplifier 150.

Figure 5:
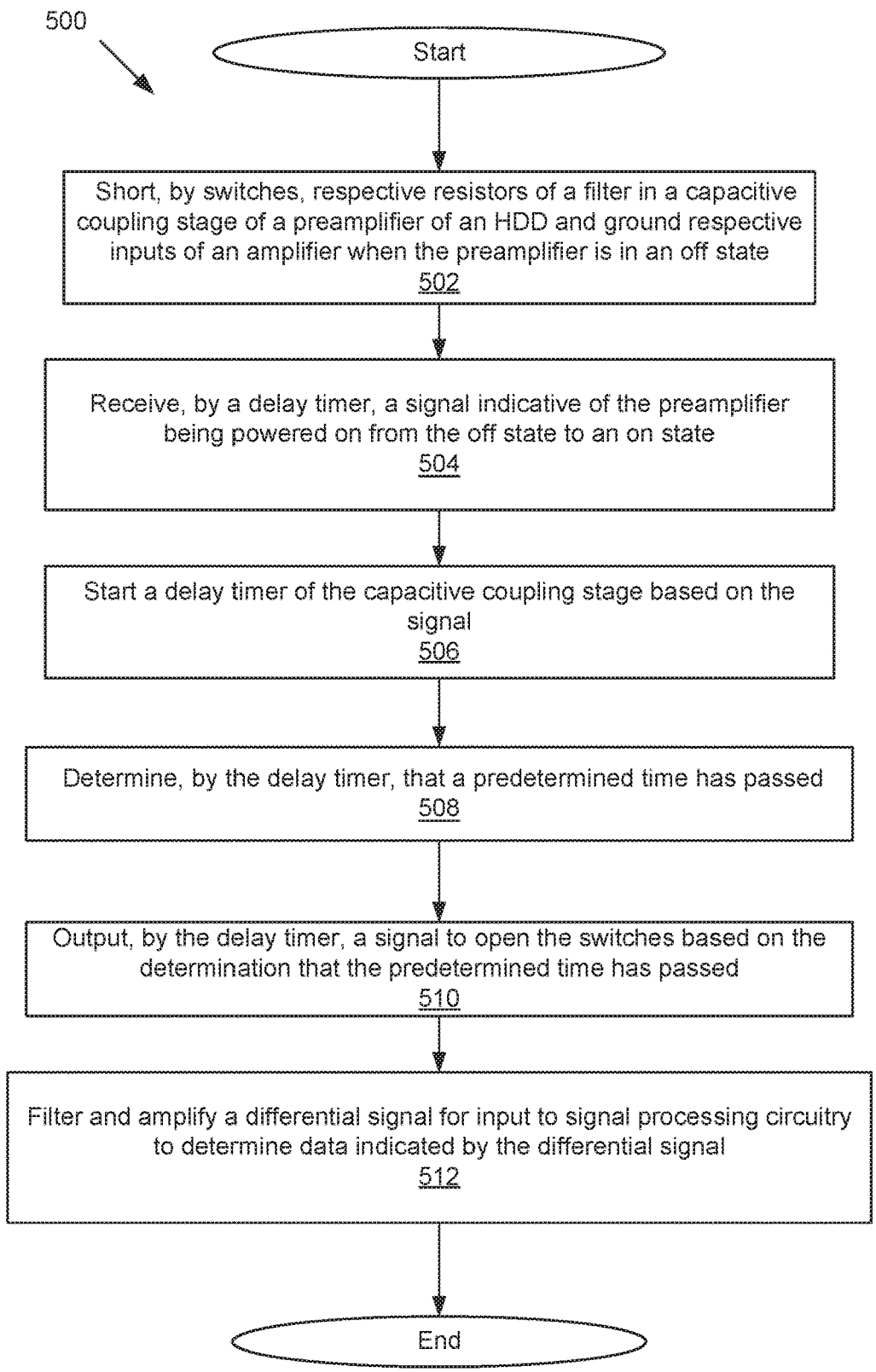
FIG. 5 is another example flow chart of functions associated with reducing the offset of the differential signal output by the capacitive coupling stage.

FIG. 5 is another example flow chart of functions 500 associated with reducing offset of the differential signal output by the capacitive coupling stage 106 of the preamplifier 150. The offset may be reduced using the offset-based switch control 130 in the form of the delay timer 200. The functions 500 may be performed by the capacitive coupling stage 106 in hardware and/or circuitry.

At 502, one or more switches 126, 128 short respective resistors 120, 122 of a filter in a capacitive coupling stage 106 of a preamplifier 150 of an HDD and ground respective inputs of an amplifier 124 when the preamplifier 150 is in an off state. The preamplifier 150 may be in an off state when it is not powered. By the shorting, the filter does not filter any differential signal and the amplifier 124 does not amplify any differential signal.

At 504, a signal is received indicative of the preamplifier 150 being powered on from the off state to an on state. The signal may be from the power supply 152 which also powers one or more of the input stage 104, capacitive coupling stage 106, and gain stage 108 of the preamplifier 150. The power supply 152 may provide the signal to the control input of the delay timer 200 when the power supply 152 also powers the preamplifier 150.

At 506, a delay timer 200 of the capacitive coupling stage is started based on the signal. The differential signal received by the capacitive coupling stage 106 may have an offset which is relatively large when the preamplifier 150 is powered on from the off state to the on state compared to when the preamplifier 150 is in the on state and the offset has settled. The delay timer 200 may time whether a predetermined time has passed. The predetermined time may be a time indicative of the offset of differential signal and the capacitive charge of the capacitors 116 settling after the preamplifier 150 is powered on from the off state to the on state.

At 508, a determination is made that the predetermined time has passed such as the delay timer expiring. After the predetermined time, the offset of differential signal and the capacitive charge of the capacitors 116, 118 may have settled.

At 510, the delay timer outputs a signal to open one or more switches 128, 126 based on the determination that the predetermined time has passed. The inputs of the amplifier 124 may be no longer coupled to ground and the resistors 120, 122 may not be shorted.

At 512, a differential signal is filtered and amplified for input to signal processing circuitry 158 to determine data indicated by the differential signal. The filter may be a high pass filter which filters the DC signal and/or low frequency noise to reduce amplification of any offset by the amplifier 124 and the gain stage 108 of the preamplifier 150.

Figure 6:
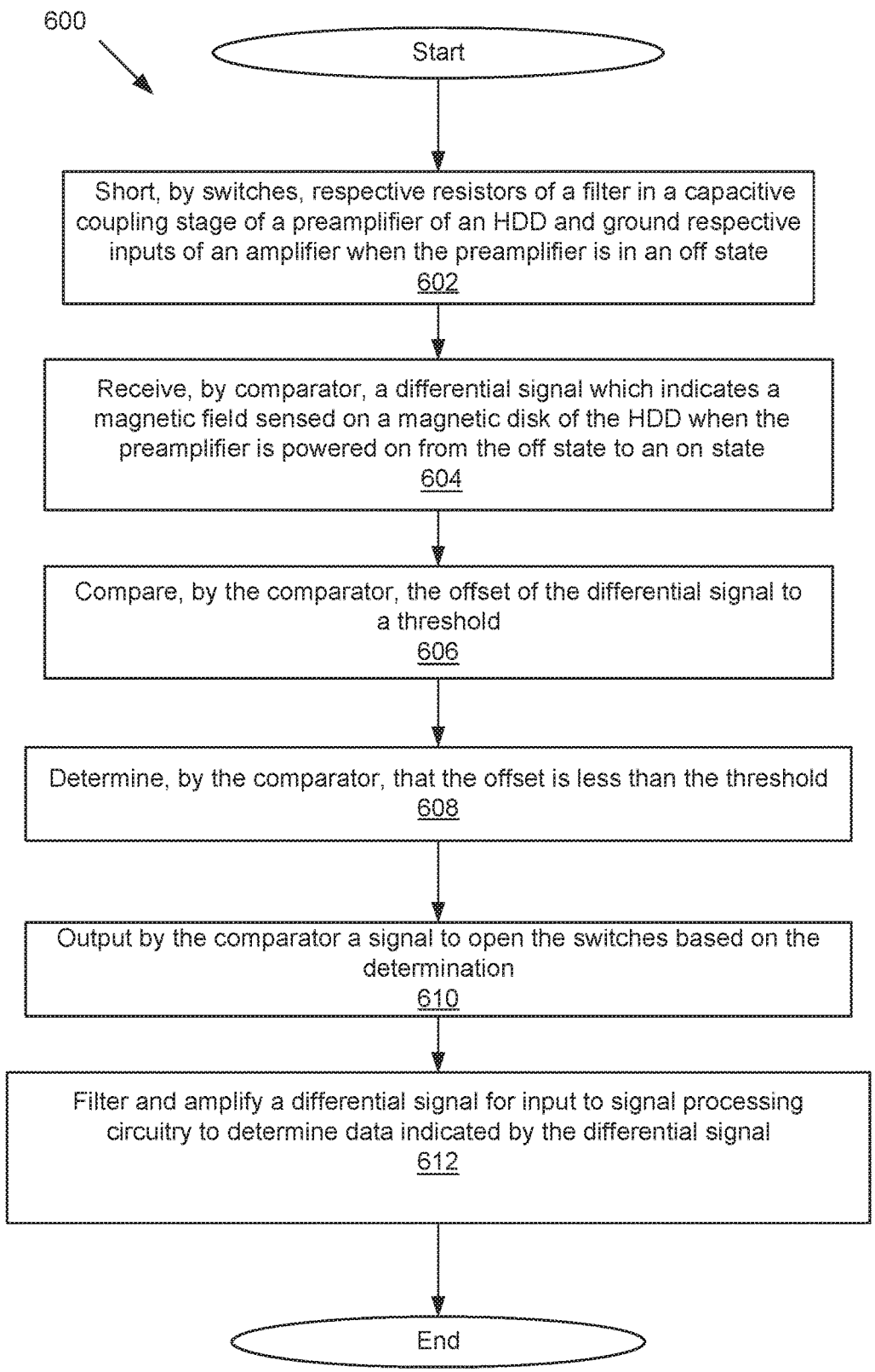
FIG. 6 is yet another example flow chart of functions associated with reducing the offset of the differential signal output by the capacitive coupling stage.

FIG. 6 is another example flow chart of functions 600 associated with reducing offset of the differential signal output by the capacitive coupling stage 106 of the preamplifier 150. The offset may be reduced using the offset-based switch control 130 in the form of the comparator 300. The functions 600 may be performed by the capacitive coupling stage 106 in hardware and/or circuitry.

At 602, switches 126, 128 short respective resistors 120, 122 of a filter in a capacitive coupling stage 106 of a preamplifier 150 of an HDD and ground respective inputs of an amplifier 124 when the preamplifier 150 is in an off state. The preamplifier 150 may be in the off state when it is not powered. By the shorting, the filter does not filter any differential signal and the amplifier 124 does not amplify any differential signal.

At 604, a comparator receives a differential signal which indicates a magnetic field sensed on a magnetic disk 154 of the HDD when the preamplifier is powered on from the off state to an on state. The power supply 152 may power one or more of the MR stage 102, capacitive coupling stage 106, and gain stage 108 of the preamplifier 150. The differential signal may originate from the MR stage 102 and have an offset which is relatively large when the preamplifier 150 is powered on from the off state to the on state compared to when the preamplifier 150 is in the on state and the offset has settled.

At 606, the comparator 300 compares the offset of the differential signal to a threshold. The threshold may indicate the offset of differential signal settling after the preamplifier 150 is powered on from the off state to the on state.

At 608, the comparator 300 determines that the offset is less than the threshold. The offset may be settled if it is less than the threshold. Additionally, if the offset has settled, the capacitive charge of the capacitors 116, 118 may have settled.

At 610, the comparator 300 outputs a signal which causes the switches 126, 128 to open based on the determination. The inputs of the amplifier 124 may be no longer coupled to ground and the resistors 120, 122 may not be shorted.

At 612, the differential signal is filtered and amplified for input to signal processing circuitry 158 to determine data indicated by the differential signal. The filter may be a high pass filter which filters the DC signal and/or low frequency noise to reduce amplification of any offset by the amplifier 124 and gain stage 108 of the preamplifier 150.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof: including potentially a program operable to cause one or more data processing apparatus such as a processor to perform the operations described (such as a program encoded in a non-transitory computer-readable medium, which can be a memory device, a storage device, a machine-readable storage substrate, or other physical, machine readable medium, or a combination of one or more of them).

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Other implementations fall within the scope of the following claims.

What is claimed is:

1. A preamplifier comprising:
an input stage; and
a capacitive coupling stage,
wherein the input stage is arranged to receive a differential signal from a magnetic resistor (MR) which indicates a magnetic field sensed on a magnetic disk of a hard disk drive (HDD) when the preamplifier is powered on from an off state to an on state, and
wherein the capacitive coupling stage includes
one or more inputs arranged to receive the differential signal from the input stage,
a filter comprising a first resistor, a second resistor, a first capacitor, and a second capacitor,
an amplifier comprising a first input and a second input, wherein the first capacitor is coupled to the first input and the second capacitor is coupled to the second input,
a first switch and a second switch in parallel with respective resistors, the first switch and the second switch being closed to short the first resistor and the second resistor when the preamplifier is powered on from the off state to the on state and to ground the first input and the second input of the amplifier,
a switch control arranged to determine that an offset of the differential signal has settled and to open the first switch and the second switch based on the determination to cause the first resistor and the second resistor to not be shorted and to not ground the first input and the second input of the amplifier, and
an output arranged to provide a filtered and amplified differential signal.

2. The preamplifier of claim 1, wherein the filter is a high pass filter which filters a direct current (DC) signal of the differential signal when the first switch and the second switch are open.

3. The preamplifier of claim 1, further comprising a gain stage for providing the filtered and amplified differential signal to signal processing circuitry which determines data on the magnetic disk based on the differential signal.

4. The preamplifier of claim 1, wherein the switch control comprises a delay timer arranged to open the one or more switches based on a determination that a predetermined time has passed.

5. The preamplifier of claim 4, wherein the predetermined time is a duration that the preamplifier is powered on from the off state to the on state.

6. The preamplifier of claim 4, wherein the delay timer is coupled to a power supply to receive a signal from the power supply to start the delay timer.

7. The preamplifier of claim 4, wherein the delay timer outputs a signal to open the one or more switches based on the determination that the predetermined time has passed.

8. The preamplifier of claim 1, wherein the switch control comprises a comparator arranged to receive the differential signal, determine the offset of the differential signal, and compare the offset to a threshold.

9. The preamplifier of claim 8, wherein the comparator is further arranged to output a signal to open the one or more switches based on the offset being less than the threshold.

10. The preamplifier of claim 8, wherein the comparator comprises two inputs which receive respective signals of the differential signal.

11. A method comprising:
receiving a differential signal associated with a magnetic resistor which indicates a magnetic field sensed on a magnetic disk of a hard disk drive when a preamplifier of the HDD is powered on from an off state;
determining that an offset of the differential signal has settled; and
filtering, by a filter, the differential signal based on the determination.

12. The method of claim 11, wherein determining that the offset has settled comprises determining that a predetermined time has passed.

13. The method of claim 12, wherein the predetermined time is a duration that the preamplifier is powered on from the off state.

14. The method of claim 11, wherein determining that the offset of the differential signal has settled comprises receiving an input from a power supply to start a delay timer.

15. The method of claim 11, wherein determining that the offset of the differential signal has settled comprises receiving, by a comparator, the differential signal, determining, by the comparator, the offset of the differential signal, and comparing, by the comparator, the offset to a threshold.

16. The method of claim 11, further comprising shorting, by a first switch and a second switch, resistors of the filter when the preamplifier is in the off state, wherein the short grounds a first input and a second input of an amplifier coupled to capacitors of the filter and opening the first switch and the second switch based on the determination that the offset of the differential signal has settled which causes the resistors to not be shorted and the first input and the second input of the amplifier to not be grounded.

17. The method of claim 16, further comprising outputting by a delay timer a signal to open the one or more switches based on the determination that a predetermined time has passed.

18. The method of claim 16, further comprising outputting, by a comparator, a signal to open the one or more switches based on the offset being less than a threshold.

19. The method of claim 11, further comprising providing the differential signal which is filtered to signal processing circuitry which determines data on the magnetic disk based on the differential signal.

20. A capacitive coupling stage of a preamplifier, the capacitive coupling stage comprising:
one or more one buffers coupled to respective inputs of an input stage of the preamplifier;
an amplifier;
a filter comprising a first resistor with a first terminal coupled to a first input of the amplifier and a second terminal coupled to ground, a second resistor with a third terminal coupled to a second input of the amplifier and a fourth terminal coupled to the ground, and capacitors;
a first switch and a second switch, wherein a fifth terminal of the first switch is coupled to the first terminal, a sixth terminal of the first switch is coupled to the second terminal, a seventh terminal of the second switch is coupled to the third terminal and an eighth terminal of the second switch is coupled to the fourth terminal, the first switch and the second switch arranged to be opened or closed;
a switch control arranged to determine that an offset of a differential signal received from the input stage has settled and to open the first switch and the second switch which are closed based on the determination; and
an output.

* * * * *